United States Patent
Joshi et al.

(10) Patent No.: US 6,806,580 B2
(45) Date of Patent: Oct. 19, 2004

(54) MULTICHIP MODULE INCLUDING SUBSTRATE WITH AN ARRAY OF INTERCONNECT STRUCTURES

(75) Inventors: Rajeev Joshi, Cupertino, CA (US); Maria Cristina B. Estacio, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 32 days.

(21) Appl. No.: 10/330,741

(22) Filed: Dec. 26, 2002

(65) Prior Publication Data

US 2004/0125573 A1 Jul. 1, 2004

(51) Int. Cl.⁷ .................. H01L 23/48; H01L 23/52; H01L 29/40
(52) U.S. Cl. .................. 257/777; 257/686
(58) Field of Search .................. 257/777, 686, 257/778, 723, 734, 302; 438/109, 110, 108

(56) References Cited

U.S. PATENT DOCUMENTS

| | | | |
|---|---|---|---|
| 5,627,460 A | | 5/1997 | Bazinet et al. |
| 5,841,197 A | * | 11/1998 | Adamic, Jr. .......... 257/777 |
| 5,973,367 A | | 10/1999 | Williams |
| 6,031,279 A | * | 2/2000 | Lenz .................. 257/686 |
| 6,133,634 A | | 10/2000 | Joshi |
| 6,166,528 A | | 12/2000 | Rossetti et al. |
| 6,294,829 B1 | * | 9/2001 | Liu .................... 257/723 |
| 6,423,623 B1 | | 7/2002 | Bencuya et al. |
| 6,469,384 B2 | | 10/2002 | Joshi |
| 6,489,678 B1 | | 12/2002 | Joshi |

OTHER PUBLICATIONS

Klein, M. et al, "Comparison of Planar and 3D MCM Technology," TU–Berlin and Fraunhofer Institut IZM, Germany, Oct. 5, 2000.

Dehkordi, P., et al, "Performance Comparison of MCM–D and SMT Packaging Technologies for a DSP Subsystem," University of Tennessee.

* cited by examiner

*Primary Examiner*—S. V. Clark
(74) *Attorney, Agent, or Firm*—Townsend and Townsend and Crew LLP

(57) ABSTRACT

A multichip module is disclosed. In one embodiment, the multichip module includes a substrate having a first side and a second side, the first side being opposite to the first side. A driver chip is at the first side of the substrate. A semiconductor die comprising a vertical transistor is at the second side of the substrate. The driver chip and the semiconductor die are in electrical communication through the substrate.

18 Claims, 5 Drawing Sheets

MULTICHIP MODULE INCLUDING SUBSTRATE WITH AN ARRAY OF INTERCONNECT STRUCTURES

BACKGROUND OF THE INVENTION

There are a number of semiconductor die packages. In one example of a semiconductor die package, a semiconductor die is mounted to a lead frame with leads. Wires couple the semiconductor die to the leads. The wires, the semiconductor die and then the most of the lead frame (except for the leads that extend outward) are then encapsulated in a molding material. The molding material is then shaped. The formed semiconductor die package includes a molded body that has leads extending laterally away from the molded body. The semiconductor die package is then mounted onto a circuit board.

While such semiconductor packages are useful, improvements could be made. For example, as consumer electronics (e.g., cell phones, laptop computers, etc.) continue to decrease in size, there is an ever increasing demand to decrease the thickness of electronic devices while increasing the density of devices. In addition, there is a need to improve the heat dissipation properties of a conventional semiconductor die package. Dissipating heat from chips is a continuing problem in the field of semiconductor packaging. Other problems that need to be addressed include reducing inductances in the conductive paths leading to and from components on a circuit board, reducing the "on resistance" (RDSon) of components on a circuit board, reducing the footprint of components on a circuit board, and generally improving the performance of a multichip module over conventional die packages and conventional multichip modules.

Embodiments of the invention address these and other problems individually and collectively.

SUMMARY OF THE INVENTION

Embodiments of the invention relate to multichip modules. The multichip modules may contain components that can form part of an electrical device such as a synchronous buck converter.

One embodiment of the invention is directed to a multichip module. The multichip module comprises: (a) a substrate having a first side and a second side, the second side being opposite the first side; (b) a chip at the first side of the substrate; (c) a semiconductor die comprising a vertical transistor at the second side, wherein the chip and the semiconductor die are in electrical communication through the substrate; and (d) an array of solder interconnect structures at the second side of the substrate.

Another embodiment of the invention is directed to a multichip module. The multichip module comprises: (a) a ceramic substrate having a first side and a second side, the first side being opposite the first side; (b) a driver chip at the first side of the substrate; (c) a first semiconductor die comprising a first vertical transistor at the second side, wherein the driver chip and the first semiconductor die are in electrical communication through the ceramic substrate; (d) a second semiconductor die comprising a second vertical transistor at the second side, wherein the driver chip and the second semiconductor die are in electrical communication through the ceramic substrate; and (e) an array of solder interconnect structures disposed around the first and second semiconductor dies.

These and other embodiments of the invention are described in further detail below.

BRIEF DESCRIPTION OF THE DRAWINGS

In FIGS. 1–7, like numerals designate like elements.

DETAILED DESCRIPTION

Embodiments of the invention are directed to multichip modules. One embodiment of the invention is directed to a multichip module comprising a substrate having a first side and a second side, the second side being opposite the first side. A driver chip package comprising a driver chip is at the first side of the substrate. A semiconductor die comprising a vertical transistor is at the second side. The driver chip package and the semiconductor die are in electrical communication through the substrate. In preferred embodiments, the substrate comprises a ceramic substrate (e.g., an alumina substrate) and an array of solder interconnect structures is formed at the second side of the substrate around the semiconductor die.

The components in the multichip module may form part of any suitable electronic circuit. For example, as explained in detail below, the components in the multichip modules according to embodiments of the invention can form part of a synchronous Buck converter. Synchronous Buck converters are used to step down an input voltage, and are described in further detail below. Although synchronous Buck converters are described in detail herein, it is understood that the multichip modules according to embodiments of the invention could be part of electronic circuits that do not include a synchronous Buck converter.

Figure 1:
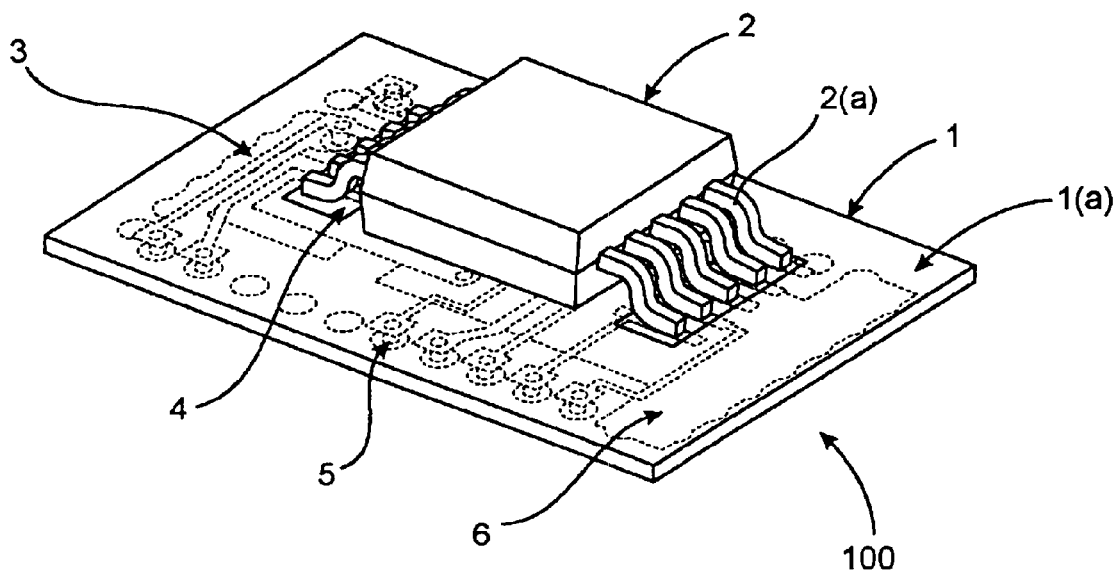
FIG. 1 shows a top perspective view of a multichip module according to an embodiment of the invention.

FIG. 1 shows a top perspective view of a multichip module 100 according to an embodiment of the invention. The multichip module 100 includes a driver chip package 2 having a number of leads 2(*a*), and is mounted on a first side 1 (*a*) of a substrate 1. Solder (not shown) such as Pb-Sn solder may be used to mechanically and electrically couple the leads 2(*a*) of the driver chip package 2 to the substrate 1. The solder that is used to couple the leads 2(*a*) of the driver chip package 2 to the substrate 1 may be present on the conductive lands 4.

The driver chip package 2 is illustrated as being a leaded package. In other embodiments, the driver chip package could be a leadless chip package. Regardless of whether the driver chip package is leaded or leadless, suitable driver chip packages can be commercially obtained. For example, suitable driver chip packages (e.g., FAN 5003 drivers) can be obtained from Fairchild Semiconductor, Inc. of Portland, Me.

The conductive traces 3 and conductive lands 4 are at the first side 1(*a*) of the substrate 1. The conductive traces 3 and the conductive lands 4 can comprise any suitable material and can be made in any suitable manner. For example, the conductive traces 3 and the conductive lands 4 can comprise a material such as copper, aluminum, refractory metals, and alloys thereof. They can be made using processes known to those skilled in the art. For example, exemplary processes include metal deposition processes such as electroplating and sputtering that are used in conjunction with photolithography processes.

Figure 2:
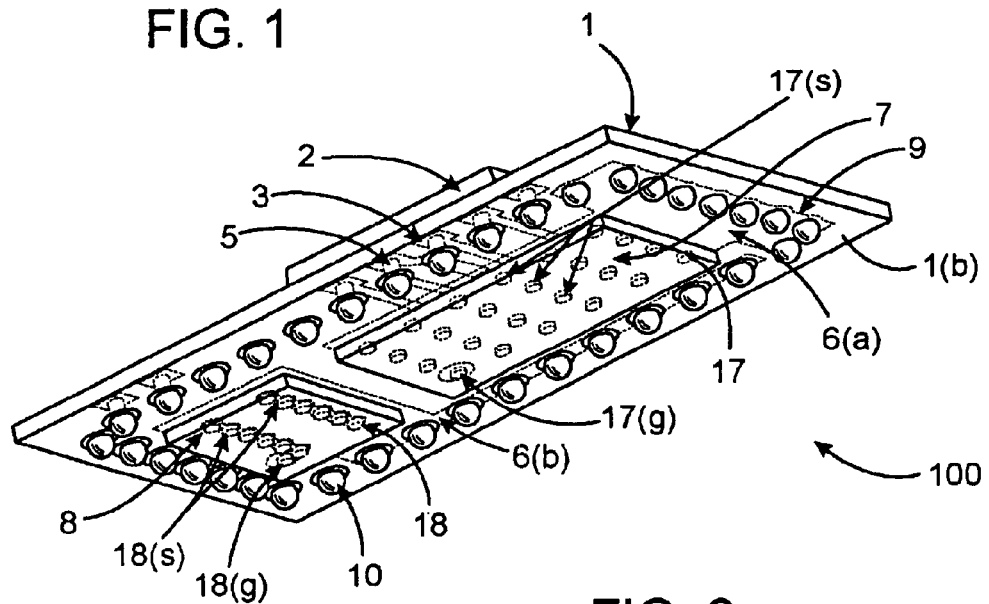
FIG. 2 shows a bottom perspective view of a multichip module according to an embodiment of the invention.

FIG. 2 shows the multichip module 100 shown in FIG. 1 from a bottom perspective view. The substrate 1 has a second side 1(b) that is opposite to the first side 1(a). A first semiconductor die 7 and a second semiconductor die 8 are mounted to the second side 1(b). The first semiconductor die 7 can include a first MOSFET including a first source region and a first gate region at a first side of the first semiconductor die 7, and a first drain region at an opposite second side of the semiconductor die 7. The second semiconductor die 8 can also include a second MOSFET including a second source region and a second gate region at a first side, and a second drain region at a second side of the second semiconductor die 8. In this example, the first and second drain regions of the first and second semiconductor dies 7, 8 would face away from the driver chip package 2 and would be mounted to a circuit board (not shown) using solder.

As shown in FIG. 2, unlike conventional multichip modules, embodiments of the invention have electronic components mounted on both sides of the substrate. The components can be "stacked" so that their density is maximized in the final multichip module. This increases the density of components while it also decreases the footprint of components on a circuit board.

Figure 8:
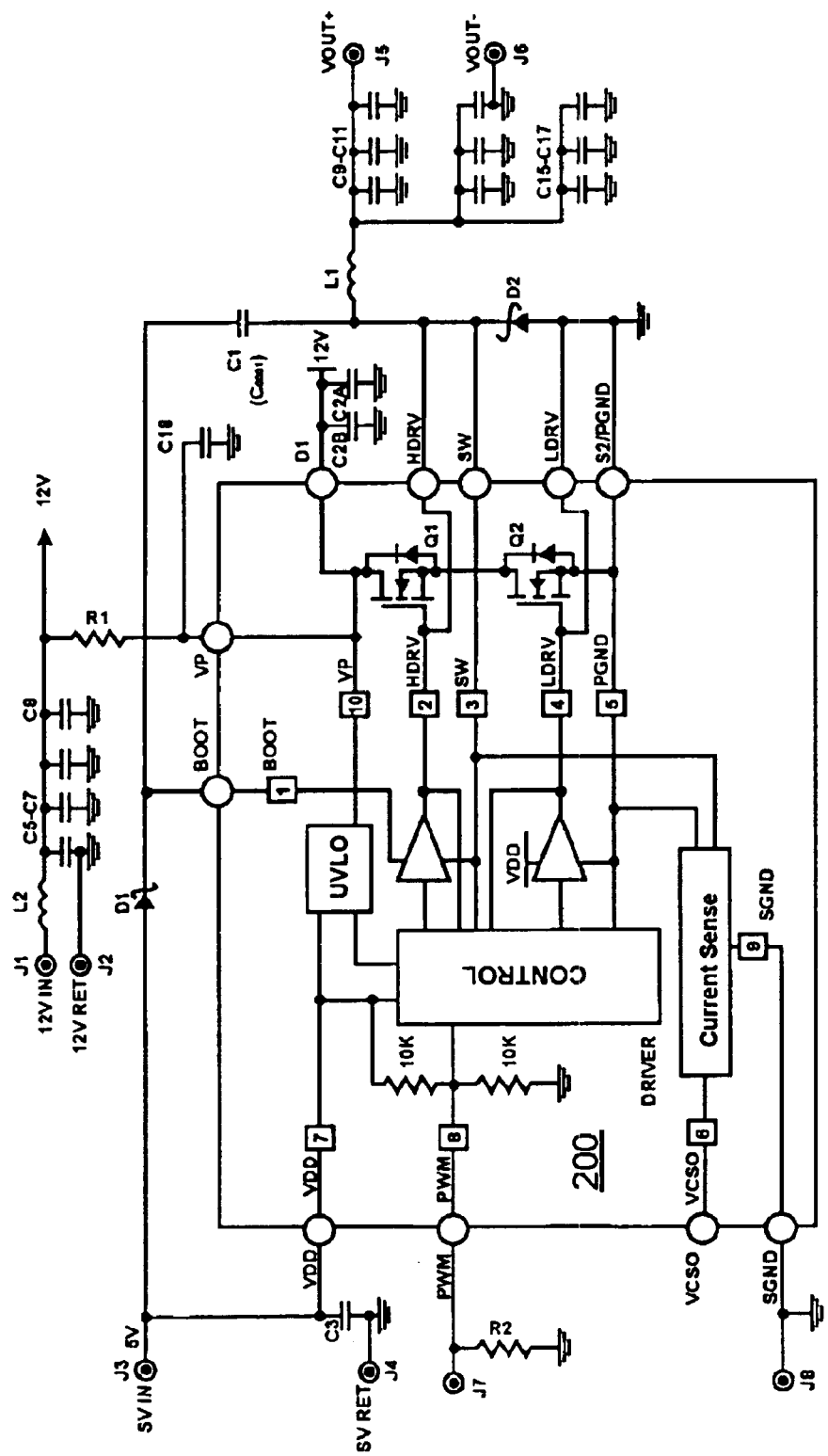
FIG. 8 shows an electrical diagram for a synchronous buck converter application.

In the illustrated example, the first MOSFET in the first semiconductor die 7 can be a "low drive field effect transistor", while the second MOSFET in the second semiconductor die 8 can be a "high drive filed effect transistor" in a synchronous Buck converter. As is known in the art of switching power supplies, or converters, a Buck topology is used to convert an input voltage to a lower output voltage. A synchronous Buck converter includes a pair of switching transistors coupled in series across the input voltage source, with a high side switch coupled to the input voltage and a low side switch coupled to ground. The switches are controlled to alternately conduct with complementary duty cycles to maintain a predetermined output voltage. In the embodiment shown in FIGS. 1 and 2, the driver chip in the driver chip package 2 can be used to control the switching in the first and second MOSFETs in the first and second semiconductor dies 7, 8. An output filter (not shown in FIGS. 1 and 2), including an inductor and a capacitor, is coupled to the interconnection between the pair of switching transistors and averages the switched input voltage to provide the lower output voltage. In general, Buck converters are known in the art. An exemplary circuit diagram for a Buck converter is shown in FIG. 8 of the present application. It includes a driver 200 that controls MOSFETs Q1 and Q2. Other examples of Buck converters are described in U.S. Pat. Nos. 5,627,460, 6,222,352, and 6,166,528. All of these U.S. Patents are herein incorporated by reference in their entity.

The transistors in the first and second semiconductor dies 7, 8 can include vertical power transistors. Vertical power transistors include VDMOS transistors and vertical bipolar power transistors. A VDMOS transistor is a MOSFET (metal oxide semiconductor field effect transistor) that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. During operation, the current flow from the source region to the drain region in a VDMOS device is substantially perpendicular to the die surfaces. In other embodiments, the transistors in the semiconductor dies can be bipolar transistors. In such embodiments, one side of the semiconductor die can have an emitter region and a base region. The other side of the die can have a collector region.

The first and the second semiconductor dies 7, 8 can be mounted to the second side 1(b) of the substrate 1 using first and second sets of solder joints 17, 18. The first set of solder joints 17 can include a first plurality of source solder joints 17(s) coupled to a first source region of a first MOSFET in the first semiconductor die 7, and a first gate solder joint 17(g) coupled to a first gate region of a MOSFET in the first semiconductor die 7. The second set of solder joints 18 can include a second plurality of source solder joints 18(s) coupled to a second source region of a second MOSFET in the second semiconductor die 8, and a gate solder joint 18(g) coupled to a gate region of the second MOSFET.

The drain regions of the first and second MOSFETs in the first and second semiconductor dies 7, 8 would be distal to the substrate 1 while the source and the gate regions would be proximate to the substrate 1. When the multichip module 100 is mounted to a circuit board (not shown), the drain regions of the first and second MOSFETs in the first and second semiconductor dies 7, 8 are soldered to conductive pads on the circuit board.

Like the first side 1(a) of the substrate 1, the second side 1(b) of the substrate 1 can be metallized with conductive regions 9 such as conductive lines, conductive lands, etc. The conductive regions 9 can include the same or different materials, and/or can be made by the same or different method as the conductive traces 3 and conductive lands 4 on the first side 1 (a) of the substrate 1. In FIG. 2, the substrate 1 has a bottom side conductive region 6(a) that provides a source connection (e.g., a low side source connection) for the first semiconductor die 7. The substrate 1 also has a bottom side conductive region 6(b) that provides a source connection (e.g., a high side source connection) for the second semiconductor die 8.

As shown in FIG. 2, an array of solder interconnect structures 10 (e.g., solder balls) is disposed around the first and second semiconductor dies 7, 8. In this example, the solder interconnect structures 10 can be at the periphery of the substrate 1 and can substantially completely surround the first and second semiconductor dies 7, 8. Some of the solder interconnect structures 10 are in communication the driver chip package 2 on the first side 1(a) of the substrate through a number of conductive vias 5 that are also at the periphery of the substrate 1.

The array of solder interconnect structures 10 can be formed by any suitable method including solder paste printing, solder ball pick and place, etc. A subsequent reflow step can be performed to reflow the deposited solder. Solder deposition and reflow processes are known in the art.

In the example shown in FIG. 2, the first and second semiconductor dies 7, 8 are unpackaged. Unpackaged semiconductor dies do not have a molding compound that encapsulates them. However, in other embodiments, the first and second semiconductor dies 7, 8, could be packaged with a molding compound, or with any other suitable material. If they are packaged, the resulting die packages may be leadless or leaded. Examples of packaged dies are described in U.S. Pat. Nos. 6,469,384 and 6,133,634, both by Rajeev Joshi, a co-inventor in the present application. These U.S. Patents are herein incorporated by reference.

Figure 3:
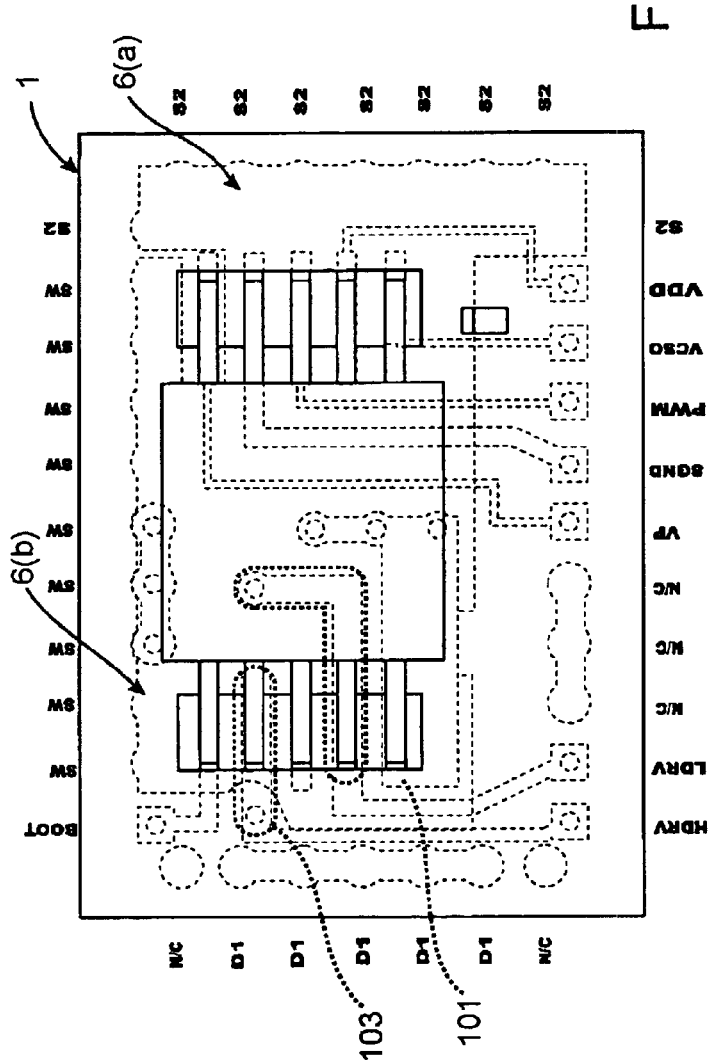
FIG. 3 shows a top plan view of a multichip module according to an embodiment of the invention.

FIG. 3 shows a top, planar view the multichip module 100. In FIG. 3, a number of abbreviations (e.g., D1, S1, etc.) are shown. These abbreviations correspond to the solder interconnect structures at the second side of the substrate 1. The abbreviations are described below with reference to FIGS. 6 and 8.

Some advantages of the multichip module 100 can be described with reference to FIG. 3. Reference numeral 101 shows a connection between a lead of the driver chip package 2 and gate region in the low side MOSFET in the first semiconductor die 7. Reference numeral 103 shows a connection between a lead of the driver chip package 2 and the gate region of the high side MOSFET in the second semiconductor die 8. Low drive signals pass through the circuit path shown by reference numeral 101 and high drive signals pass through the circuit path shown by reference numeral 103. As shown, the interconnect path lengths between the driver chip package 2 and the MOSFETs in the semiconductor dies 7, 8 are short. This reduces inductance in the conductive paths leading to the MOSFETs.

Figure 4:
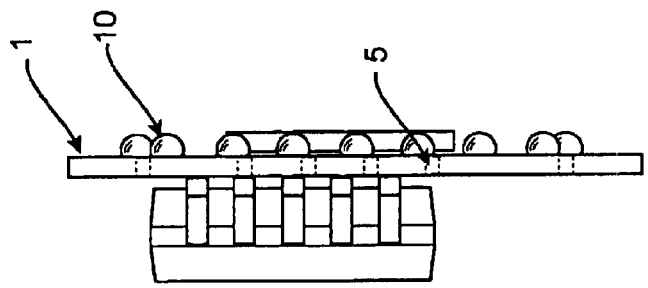
FIG. 4 shows a side view of a multichip module according to an embodiment of the invention.
Figure 5:
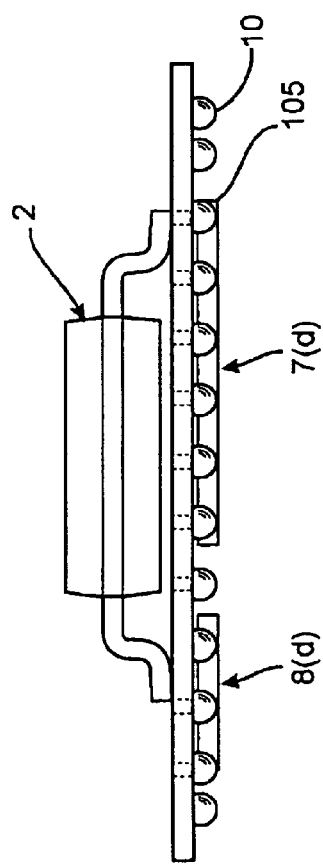
FIG. 5 shows a front view of a multichip module according to an embodiment of the invention.

FIG. 4 shows a side, cross-sectional view of the multichip module 100. FIG. 5 shows a front view of the multichip module 100. In FIG. 5, first and second drain regions 7(d), 8(d) of the first and second MOSFETs in the first and second semiconductor dies 7, 8 are shown. In some embodiments, the first and second drain regions 7(d), 8(d) can be soldered directly to conductive regions (e.g., conductive copper regions) of a circuit board (not shown). This helps to dissipate heat from the first and second semiconductor dies 7, 8. For example, with respect to the high side and low side MOSFETs Q1 and Q2 shown in the circuit diagram in FIG. 8, the MOSFETs Q1 and Q2 are cooled via their drain connections to the printed circuit board. Both MOSFETs Q1 and Q2 will dissipate considerable heat. Maximizing the contact area between the copper on a circuit board and the drains of MOSFETs Q1 and Q2 maximizes heat dissipation.

Other advantages of the multichip module 100 can be described with reference to FIGS. 4 and 5. First, as shown in FIG. 5, the backsides of the semiconductor dies 7, 8 are exposed. Flipchip technology can be used to mount the multichip module 100 to a drain connection to a board. In this way, the multichip module has optimum RDSon and power dissipation performance. A lower RDSon will consequently allow for high speed switching performance. Second, the planar die back stand-off to the peripheral solder balls 10 ensures uniform stand-off height of the final multichip module 100 after mounting it to a circuit board (not shown).

Figure 6:
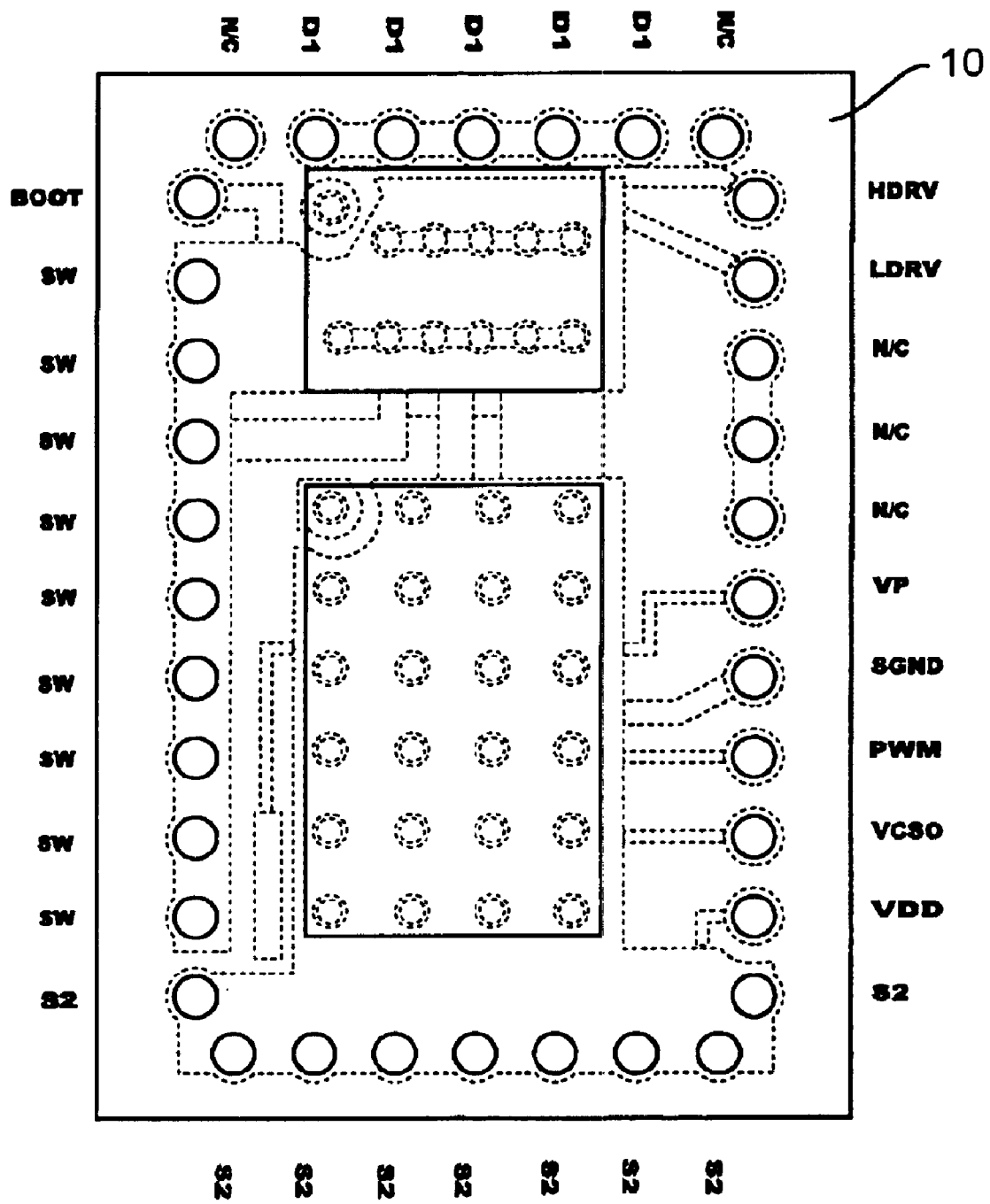
FIG. 6 shows a bottom plan view of a multichip module according to an embodiment of the invention.

FIG. 6 shows a bottom view of the multichip module 100. In this view, the solder interconnect structures 10 are more clearly shown. The various peripheral solder interconnect structures 10 in FIG. 6 can correspond to the various pins in the driver 200 in the circuit diagram shown in FIG. 8, and the driver chip package 2 shown in FIGS. 1 and 2. BOOT refers to "Boot strap input". A capacitor is connected from this pin to the SW node. SW refers to "switch node". These balls are connected to the source of Q1 as well as the driver chip package's SW pin. It is connected to the drain pad of Q2 to form the junction between the source of the upper MOSFET and the drain of the lower MOSFET. SW is also the return path for Q1's gate drive current. S2 refers to "Source of Q2/PGND". S2 is connected to power ground.

VDD refers to a power supply input such as a 5 V IC power supply input. VSCO refers to "current sense voltage out". The voltage at this pin can be 10 times the voltage drop across the MOSFET Q2 when LGATE (low side gate) is driven high and UGATE (high side gate) is driven low. PWM refers to "PWM input signal". This pulse width modulation signal comes from the PWM controller and is used to control the states of the gate drives. If the pin is high, the upper MOSFET is driven on and the LGATE is driven low. If low, the LGATE is driven high and the UGATE is driven low. If left open, this pin will drive both the UGATE and the LGATE low. SGND refers to "signal ground". This is connected to the ground of the PWM controller. VP is a 12 Volt power input that is sensed via an internal divider for under-voltage lockout. N/C means no connection. LDRV means low side MOSFET gate drive output. HDRV means high-side MOSFET gate drive output.

Figure 7:
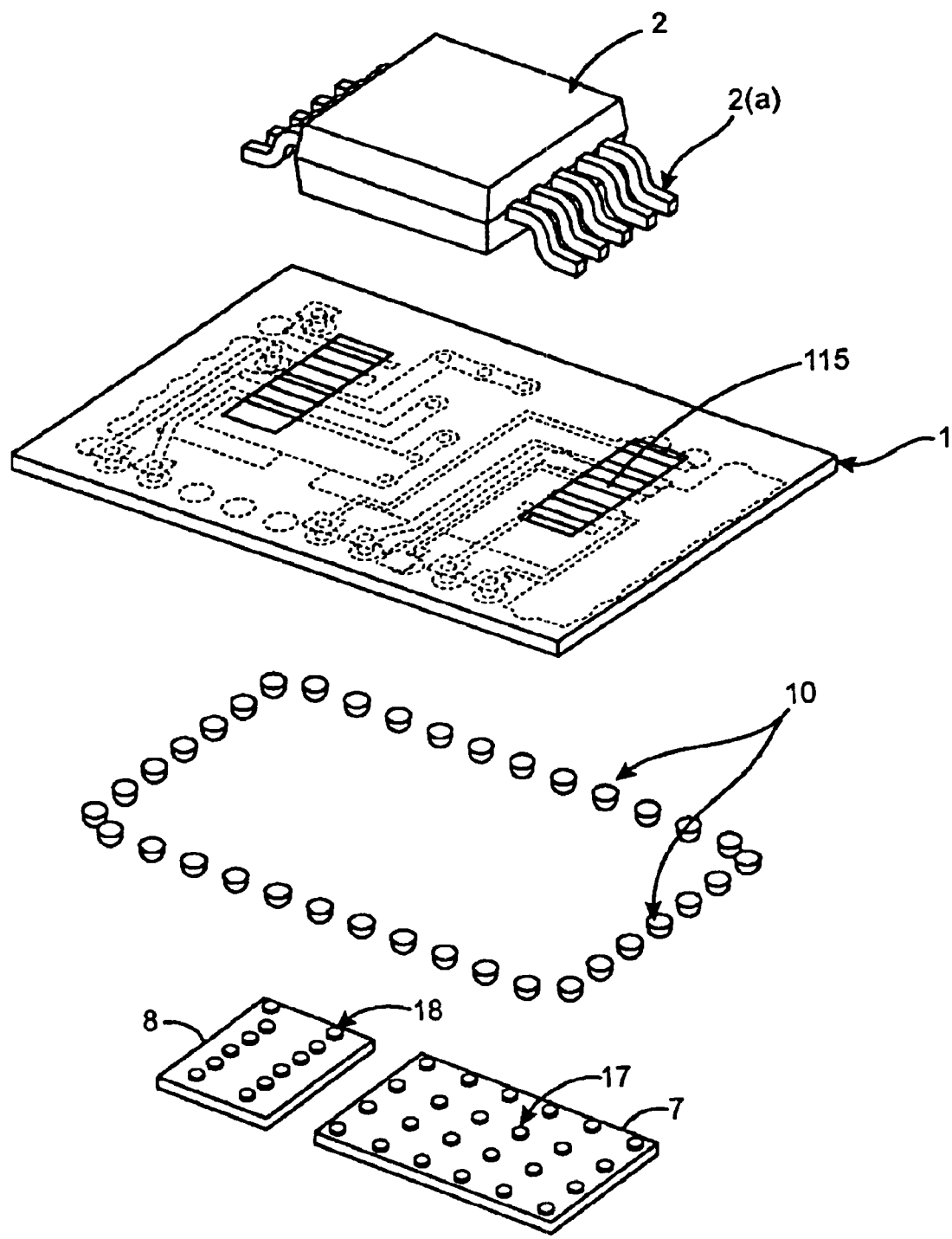
FIG. 7 shows an exploded view of a multichip module according to an embodiment of the invention.

FIG. 7 shows an exploded view of the multichip module 100. Other advantages of embodiments of the invention can be described with reference to FIG. 7. First, as shown by reference numeral 115, top and bottom surface metal traces provide for shorter interconnection lengths between the driver chip package 2 and the MOSFETs in the first and second semiconductor dies 7, 8. The particular trace layouts can be altered as desired by the end user, while retaining the same solder interconnect and die-back footprint layout to the circuit board (not shown). Second, the solder interconnect structures 10 at the periphery of the substrate 1 allow for shorter interconnect paths to adjacent devices for further performance optimization as per the intended application, while at the same time, improving board space utilization. Third, the substrate 1 can be a ceramic substrate. Ceramic substrates have good thermal conductivity through the substrate, good thermal stability, and good moisture resistance. Of course, other substrates could be used in embodiments of the invention depending on the particular field of use for the multichip module 100. Fourth, the top driver chip package 2 experiences lower temperatures during duty cycles as compared to those when the components are individually mounted on a circuit board. In a dual MOSFET with driver as illustrated in FIG. 8, the simulated thermal performance on different board configurations showed that a FAN5003 driver (commercially available from Fairchild Semiconductor, Inc.) will be 42 to 56 degrees C lower than a conventional layout for that same component.

The multichip module 100 can be formed in any suitable manner. For example, in some embodiments, conductive traces can be formed on the first and second sides 1(a), 1(b) of the substrate 1. Then, a preformed driver chip package 2 can be mounted on the first side of the substrate 1 using, for example, solder. After the driver chip package 2 is mounted to the substrate 1, the first and second semiconductor dies 7, 8 can be mounted to the second side 1(b) of the substrate 1 using a flip chip process. Then, the solder interconnect structures 10 at the periphery can be formed as described above. As noted above, the solder interconnect structures 10 can be formed by stencil printing, pick and place processes, etc. Once the multichip module 100 is formed, it can, in turn, be mounted to a circuit board (not shown) using a flip chip process. Of course, it is possible to reverse the order of one or more of these processes and one can still produce the multichip module 100.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. For example, although packaged driver chips are described in detail, it is understood that in other embodiments, one or more unpackaged driver chips could be mounted to the above-described substrate using a direct chip attach process.

Moreover, one or more features of one or more embodiments of the invention may be combined with one or more features of other embodiments of the invention without departing from the scope of the invention.

What is claimed is:

1. A multichip module comprising:
   (a) a substrate having a first side and a second side, the second side being opposite the first side;
   (b) a chip at the first side of the substrate;
   (c) a semiconductor die comprising a vertical transistor at the second side, wherein the chip and the semiconductor die are in electrical communication through the substrate; and
   (d) an array of solder interconnect structures at the second side of the substrate.

2. The multichip module of claim 1 wherein the chip is packaged and wherein the packaged chip is a driver chip package.

3. The multichip module of claim 1 wherein the semiconductor die is a first semiconductor die and the vertical transistor is a first vertical transistor, and wherein the multichip module further comprises a second semiconductor die at the second side of the substrate, wherein the second semiconductor die includes a second vertical transistor.

4. The multichip module of claim 3 wherein the first vertical transistor is a low drive FET and the second vertical transistor is a high drive FET.

5. The multichip module of claim 1 wherein the array of solder interconnects structures is disposed at a peripheral region of the substrate and around the semiconductor die.

6. The multichip module of claim 1 wherein the semiconductor die is unpackaged.

7. The multichip module of claim 1 wherein the semiconductor die is packaged.

8. The multichip module of claim 1 wherein the substrate has a single layer of ceramic.

9. The multichip module of claim 1 wherein the substrate has a single layer of ceramic and comprises alumina.

10. The multichip module of claim 1 wherein the substrate has a single layer of ceramic, and wherein the array of solder interconnect structures is around the semiconductor die.

11. A multichip module comprising:
    (a) a ceramic substrate having a first side and a second side, the first side being opposite the first side;
    (b) a driver chip at the first side of the substrate;
    (c) a first semiconductor die comprising a first vertical transistor at the second side, wherein the driver chip and the first semiconductor die are in electrical communication through the ceramic substrate;
    (d) a second semiconductor die comprising a second vertical transistor at the second side, wherein the driver chip and the second semiconductor die are in electrical communication through the ceramic substrate; and
    (e) an array of solder interconnect structures disposed around the first and second semiconductor dies.

12. The multichip module of claim 11 wherein the first and second semiconductor dies are packaged.

13. The multichip module of claim 11 wherein the first and second semiconductor dies are unpackaged.

14. The multichip module of claim 11 wherein the first and second semiconductor dies are coupled to the second side of the ceramic substrate through a plurality of solder joints.

15. The multichip module of claim 11 wherein the driver chip, the first vertical transistor, and the second vertical transistor form part of a synchronous Buck converter.

16. The multichip module of claim 11 wherein the first vertical transistor includes a first power MOSFET with a first trenched gate and wherein the second vertical transistor includes a second power MOSFET with a second trenched gate.

17. The multichip module of claim 11 wherein the ceramic substrate comprises alumina.

18. The multichip module of claim 11 wherein the first and second semiconductor dies are unpackaged, and wherein the array of solder interconnect structures is an array of solder balls that substantially completely encircles the first and second semiconductor dies.

* * * * *